United States Patent [19]

Gibbons

[11] 4,399,842
[45] Aug. 23, 1983

[54] WIRE-LAYING TOOL
[75] Inventor: Ralph D. Gibbons, Hampshire, England
[73] Assignee: Lansing Bagnall Limited, Hampshire, England
[21] Appl. No.: 358,666
[22] Filed: Mar. 16, 1982
[30] Foreign Application Priority Data
Mar. 25, 1981 [GB] United Kingdom ............... 8109427
[51] Int. Cl.³ .............................................. B21F 3/00
[52] U.S. Cl. ..................................... 140/92.1; 29/850; 226/167
[58] Field of Search ................... 140/92.1, 93 R, 124; 29/747, 748, 850; 226/158, 167
[56] References Cited
U.S. PATENT DOCUMENTS
1,851,420 3/1932 Carson, Jr. ......................... 226/167

3,210,832 10/1965 Kalen .................................... 29/747

*Primary Examiner*—Francis S. Husar
*Assistant Examiner*—Linda McLaughlin
*Attorney, Agent, or Firm*—Cushman, Darby & Cushman

[57] ABSTRACT

A wire-laying tool has a central passageway terminating in a probe which can be retracted relative to a stem against the force of a spring by means of a piston movable in a chamber. A spring-loaded pawl is actuated by another piston movable in a chamber. The pawl can advance the wire in the passageway and probe forwardly of the front end of the tool. When the piston has almost completed its stroke, fluid pressure is communicated to the chamber to cause retraction of the probe. A spring-loaded dog acts as a brake for wire in the passageway. The tool is intended for use in the production of wiring harnesses with the aid of a robot manipulator.

10 Claims, 5 Drawing Figures

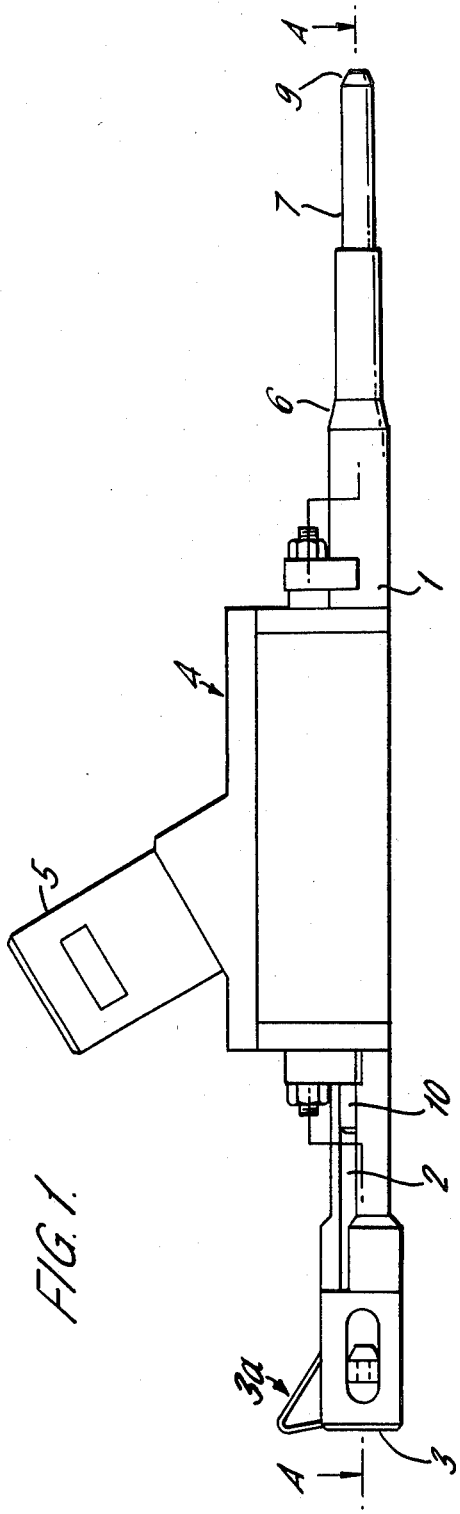
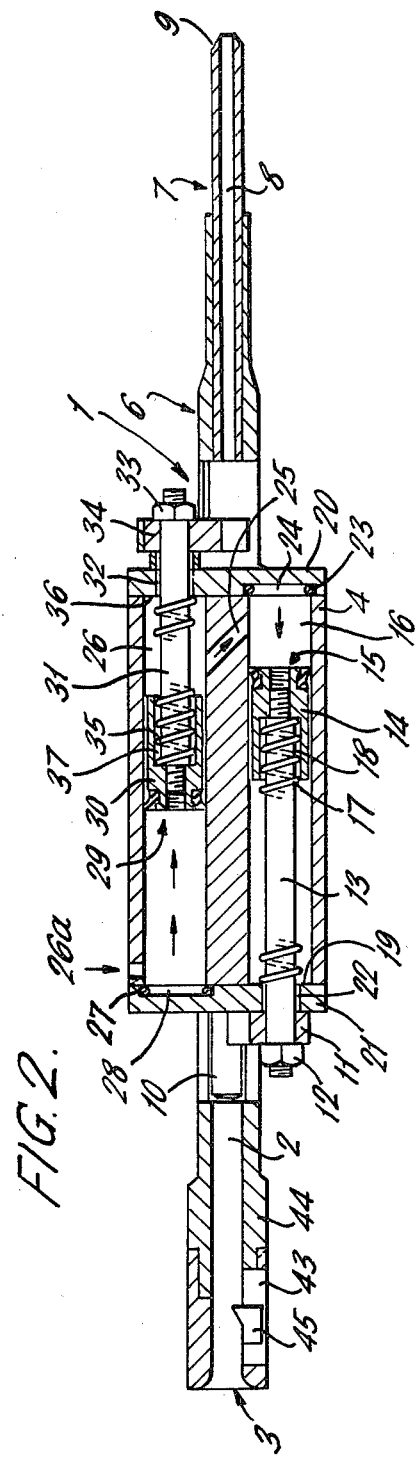
FIG. 1.
FIG. 2.

WIRE-LAYING TOOL

BACKGROUND OF THE INVENTION

This invention relates to the laying of wire and in particular to a tool capable of use in the laying of wire in the production of a wiring harness with the aid of a wiring loom table.

More particularly the present invention concerns a wire-laying tool which is capable of use in conjunction with a wire-laying robot, such as is mentioned in our European Patent Application No. 80301087.2 for the purpose of laying wire in the production of a wiring harness in the manner described in, for example, our British Patent Specification No. 2025272 and our British Patent Application No. 8109431 of even date herewith. Those methods form no part of the present invention. However, they have the common characteristic of a loom table which consists of, among other things, a wire mesh into which a programmed robot places, using a suitable gripping tool, a multiplicity of pins in a pattern appropriate for the particular harness which is to be made. The harness usually consists of a multiplicity of wires which start and terminate in respective positions but over a considerable portion of their lengths are laid along a common path. In the co-pending British patent application of even date herewith we describe a method of production in which when the pins have been laid out in the desired pattern, some of them are provided with rubber collars so that when the wires are laid adjacent to pins having rubber collars the wires are supported clear of the topmost mesh of the wiring table. For this purpose the robot exchanges the tool which is used for laying pins for another adapted for picking up the rubber collars and depositing those rubber collars over the relevant pins. Thereafter the robot exchanges that tool for another tool which is adapted for the laying of wire. This tool, which is preferably constituted by a tool according to the present invention, is, for each wire in the harness, fed with a metered length of wire and is then moved by the robot so that for each wire the leading end is wound round a "start" pin, then the balance of the wire is laid along the programmed path appropriate for that wire and finally the wire is wound around a final pin. This operation is repeated for each wire. Subsequently, the wiring harness is removed from the table, preferably by inversion of the table, which is then ready, on reinversion to be rewired with another, similar harness. At the end of a run of production of a multiplicity of harnesses, the table is finally inverted and, as described in our British Patent Specification No. 2025272, two meshes in the table are separated to remove the pins from the table.

SUMMARY OF THE INVENTION

It is, for the practice of the method which has been described in the foregoing paragraph and in similar methods desirable to provide a tool by means of which a wire can be wound around an upstanding pin and laid along a path. These two functions can be fulfilled by means of a hollow probe which can be held upright and traversed quickly in a smaller circle about the pin so as to loop the leading end of the wire around that pin, the probe thereafter merely serving as a guide for the wire, which is drawn through the probe by the movement of the probe along the predetermined path and the anchoring of the leading end of the wire by its loop around the start pin. A probe according to the present invention is intended to be capable of these functions but is adapted to facilitate such an operation by means hereinafter described. It is desirable to provide a secure, albiet temporary, anchorage for the wire before it is wound around the start pin. In order to achieve this, it may be necessary to inject a short part of the leading end of the wire into an intermediate mesh. For this purpose the leading end of the probe must be held close to the mesh. However, during the remainder of the wiring operation, the lowermost extremity of the probe must be rather higher than is appropriate for the injection of the wire into the mesh. Moreover, it is desirable to provide an efficient means in the tool for holding the leading end of the wire as it is fed into the tool so that a properly metered length can be supplied to the tool. It is the object of the present invention to provide a tool which can provide these functions and it is a further object of the invention to provide a tool which performs those functions in a simple and reliable manner.

A preferred embodiment of the present invention comprises an elongate body having a longitudinal passageway adapted for the passage of wire from a rear end to a front end, a forward extension of the passageway including a stem and a probe movably mounted with respect to the stem, resettable actuators arranged to advance wire relative to the passageway and to retract the probe with respect to the stem. Preferably means are provided for inhibiting rearward movement of the wire relative to the passageway.

In an embodiment of the invention the actuator for advancing the wire relative to the probe is coupled to a pawl arranged to bear on wire in the passageway; a second actuator is responsive to the completion of a predetermined movement of the first actuator to retract the probe relative to said stem portion.

In a particular embodiment of the invention the first actuator comprises a piston and cylinder of which the piston is coupled to the pawl and of which the cylinder has an inlet for supply of fluid pressure to the piston and a port arranged to be in communication with the inlet when the piston has executed a predetermined movement and the second actuator comprises a piston and cylinder of which the piston is coupled to the said terminal portion, said port being connected to supply fluid pressure to the second cylinder.

The stem may comprise a sleeve in which the said probe is slidably movable and relative to which the probe extends forwardly.

For inhibiting movement of the wire back through the passageway, there may be a spring-loaded dog which protrudes into the passageway.

There follows a description of a particular embodiment of this invention by way of example and with reference to the accompanying drawings.

BRIEF DESCRIPTION OF THE DRAWINGS

FIG. 1 is a side elevation of a wire-laying tool;
FIG. 2 is a section on the line A—A of FIG. 1.

DESCRIPTION OF THE PREFERRED EMBODIMENT

Figure 4:
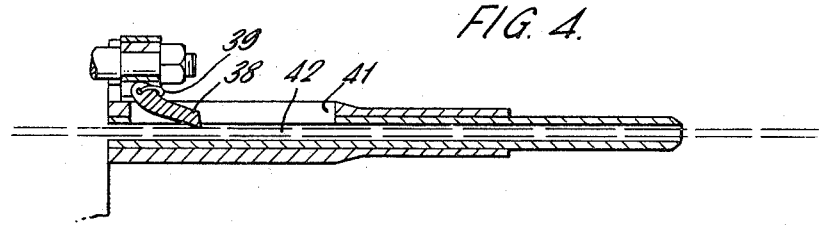
FIG. 4 is a section on the line B—B of FIG. 3.
Figure 3:
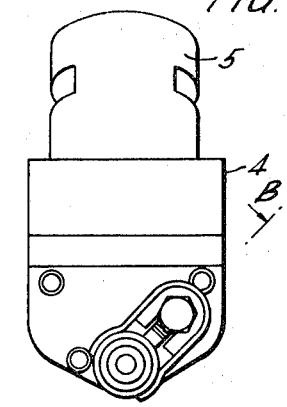
FIG. 3 is a front elevation of the wire-laying tool.

The tool shown in the drawings has a body 1 which has a longitudinal passageway 2. At the rear end 3 of the tool the passageway is flared and has a deflector plate 3a so that the tool can receive from a feeder wire which would usually be fed into the tool to the front end thereof. By means not relevant to the present invention feeding of the wire would continue, the wire falling in a loop extending from the rear end of the tool, the remote end of the wire being severed when a metered length has been delivered.

Mounted on the body 1 is another body 4 which contains two actuators which will be described hereinafter with reference to FIG. 2. This body 4 carries an oblique lateral bayonet fitting 5 by means of which the tool can be attached to a standard robot head which includes a pneumatic line. Thus the fitting 5 serves not only as a mount for the tool but as a means for receiving pneumatic pressure from a source (not shown).

Forwardly of the body 4 the body 1 terminates in a hollow stem 6 which constitutes a sleeve for an elongate hollow probe 7 which has an internal passageway 8 and terminates in a chamfered end 9.

The probe 7 extends internally of the sleeve and the passageway 2 back to a location rearward of the body 4. The rearward end 10 of the probe 7 is attached by means of a connecting lug 11 and a locking nut 12 to a threaded stem 13 which extends from the head 14 of a piston 15 disposed within a cylinder 16 defined within the body 4. A compression spring 17 is mounted on the stem 13, one end of the spring being disposed within a recess 18 at the rear of the head 14 and the other end of the spring bearing on an end face 19 of the cylinder 16. The cylinder is laterally defined by the body 4 and is closed at each end by end plates 20,21 respectively for the body 4. The stem 13 extends out of the rear end plate 21 through an aperture 22 and the forward end of the cylinder 16 is sealed by means of a circular sealing ring 23 disposed within a recess 24 formed in the plate 20 and aligned with the cylinder 16.

A port 25 interconnects the front end of the cylinder 16 to another cylinder 26 extending, as does the cylinder 16, longitudinally of the body 4 and defined between the body 4 and the two end plates 20 and 21. An inlet 26a for this cylinder is at the rearward end of the body 4. The cylinder terminates in a recess 28 formed in the end plate 21, the recess containing a circular seal 27 by means of which the plate 21 and the body 4 are sealed at this end of the cylinder. The port 25 provides communication between the cylinder 16 and that region of the cylinder 26 remote from the inlet end thereof. A piston 29 is disposed in the cylinder 26. The piston 29 has a head 30 from which extends a stem 31 through an aperture 32 in the plate 20. The stem is threaded and by means of a locking nut 33 a lug 34 is secured to the stem 31.

A compression spring 35 is disposed on the stem and extends between a recess 37 in the rear of the head 30 to the end face 36 presented by the plate 20 to the chamber 26.

As is shown in FIG. 4, the lug 34 carries a pawl 38 which is biassed by a spring 39. This pawl will bear on wire 42 within the stem 6. The pawl can move longitudinally of the stem 6 and for this purpose is accommodated in a slot 41 extending longitudinally in the wall of the stem 6.

Near the rear end of the tool is a longitudinal slot 43 in the wall 44 of the body 1. This slot accommodates a spring-loaded dog 45 which constitutes a means for preventing rearward movement of the wire within the passageway 2. The dog 45 allows forward movement of the wire but the rearward movement of the wire causes the dog to engage the wire with sufficient force to prevent more than a very slight rearward movement.

The tool would normally be loaded with wire while it is held horizontally, the wire being fed in up to the tip 9. This operation will be described in more detail later. The head would be moved to the place at which laying is to start and would be rotated to an upright position.

Figure 5:
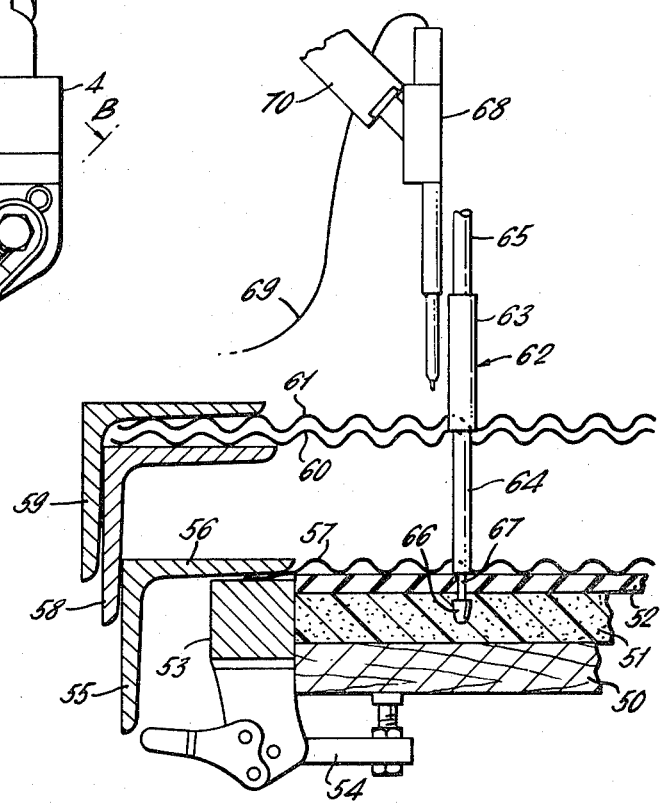
FIG. 5 illustrates one manner of operation of the tool.

FIG. 5 illustrates one mode of use of the tool in conjunction with a worktable which forms the subject of our co-pending Application No. 8109431 of even date herewith. This table comprises a base board 50 on which is disposed a layer of penetrable supporting material 51 overlaid by a rubber sheet 52. The board and the two sheets above it are supported by a side frame 53 which has clamps 54, of which only one is schematically illustrated, for the retention of the board 50 in the frame. Extending around the frame 53 is a further frame 55 made of elongate angle members of which the horizontal part extends over the respective adjacent part of the frame 53 and of which the vertical parts are disposed laterally of the frame 53. Between the horizontal parts 56 of the frame 55 and the frame 53 is the side margin of a lower steel mesh 57 disposed thereby immediately above the rubber sheet 52. Above the frame 55 are two similar frames 58 and 59, disposed immediately one above the other, the upper frame 59 being disposed partly to enclose the frame 58 and the frame 58 partly enclosing the frame 55. The frame 58 carries an upper steel mesh 60 which is separated from and above the mesh 57. The frame 59 carries a nylon mesh 61 disposed immediately above the upper steel mesh 60.

Also illustrated in FIG. 5 is a pin 62 which is preferably double-ended, having a central portion 63 of slightly larger diameter than the remainder of the pin and two shanks 64 and 65 extending one from each end of the central portion 63. Each shank terminates in a head separated from the shank by a narrow neck, only the head 66 and the neck 67 at the lower end of the pin being illustrated. Such a form of pin is preferable so that a robot head which inserts the pins in the table does not have to distinguish one end of the pin from the other.

As is described in our co-pending British Application No. 8109431 of even date herewith, the pin 62 is one of an array of pins which are laid to define the harness which is to be produced. The particular pin which is shown is selected to be a start pin for the laying of a particular wire.

FIG. 5 shows, schematically, the tool 68 disposed adjacent and parallel to the pin 62. The wire 69 with which the tool has been fed trails out of the rear, now the top end of the tool 68. The tool is shown schematically as carried by an arm 70 of a robot, which may be a Unimation robot made under the trade name "PUMA".

Although it forms no essential part of the present invention it may be mentioned at the present stage that the frame 59 can be moved so as to separate the meshes 61 and 60 and that the frame 58 can be moved together with the frame 59 so as to increase the separation of the meshes 57 and 60. When the pins such as pin 62 are inserted in the table, they are inserted so that they penetrate the two meshes 60 and 57 and so that their heads (66) enter the sheet 51, having passed through the sheet 52. The purpose of this arrangement is to enable the harness when it is completed to be removed from the table by the separation of the nylon mesh 61 from the mesh 60, this separation being preferably accompanied by an inversion of the worktable so that the harness can fall on to a conveyor. The same array of pins is normally used to produce a large number of harnesses but when the production run is completed, the meshes 60 and 57 may be separated, by movement of the frames 58 and 59 relative to the frame 55 so that, because the portion 63 of the pin cannot pass through the steel mesh 60, the heads of the pins are pulled out of the material 51, the sheet 52 and the lower mesh 57. This separation of the frames preferably occurs after an inversion of the table so that the pins can fall on to a conveyor and be conveyed thence to a feeder ready for another production cycle.

The preferred manner of commencing the wire-laying operation is to actuate the tool 68 so that the wire held within it is advanced a short distance from the tip of the probe and is thereby injected through the meshes 61, 60 and 57 so as to provide a temporary anchorage for the leading end of the wire. For this purpose the end of the probe should be close to the mesh 60. Thereafter the probe is retracted and the tool may be caused to execute a circular movement around the adjacent pin so as to loop the wire around the pin.

Thereafter the tool is traversed across the table, the wire being gradually drawn through the tool and laid along the predetermined path, having been anchored to the start pin 62. At the end of the run of wire the remote end of the wire may be wound around a final pin by the execution of a circular movement around the pin by the tool 68.

The height of the forward end of the probe during the laying of the wire should normally be somewhat higher than it is for the injection of the wire into the top mesh. As will be made apparent, the forward movement of the wire for injection is automatically followed by retraction of the probe 7 relative to the stem 6 so that the height of the lower end of the probe is suitable for the looping of the wire around the start pin 62 and the subsequent laying of the wire. This height is preferably just above the upper shoulder on pin 62.

In this embodiment of the invention, the internal actions of the tool for the reception of wire from its feed and for the injection of wire into the top mesh are as follows. In the former, the probe is in its extended position under the influence of the spring 17 and wire is fed in until the leading end reaches the tip 9 of the probe, passing the pawl 38. Whereupon the wire is held by the action of this pawl and the dog 45. Before the wire is to be injected into the meshes of the table, the tool is moved to the required position and is turned by the robot from a horizontal to a vertical position, such that the tip 9 is just above the mesh 61. Pneumatic pressure is then applied to the inlet 25 to produce movement of the piston 29 in the cylinder 26: the pawl is moved along the slot 41, pushing the wire forwardly of the tool by a distance sufficient to advance the leading end of the wire through the meshes 61, 60 and 57.

When the piston 29 reaches the end of its travel, the port 25 is exposed to the fluid pressure applied to the chamber 26 and communicates that fluid pressure to the chamber 16 so as to cause the piston 15 to move leftwardly as shown in the drawing and thereby to cause the retraction of the probe 7 relative to the stem 6. The stroke of the actuator constituted by the piston 15 and cylinder 16 is sufficient to draw the tip 9 wholly into the sleeve constituted by the stem 6. Relaxation of the pressure then permits the probe to return to its forward position and the pawl to return to its original position.

The probe 7 is retracted relative to the stem and is maintained thus by the continual application of pressure to the fitting 5 for the duration of the respective wire-laying run.

At the end of the wire-laying run the pressure applied to the inlet of the cylinder 26 may be relieved, whereupon the two pistons return under the restoring forces of the return springs 17 and 35 to their original positions.

I claim:
1. A wire-laying tool comprising:
   an elongate body having a longitudinal passageway adapted for the passage of wire from a rear end to a front end;
   a forward extension of the passageway including a stem and a probe movably mounted with respect to the stem;
   first and second actuators arranged respectively to advance wire relative to the passageway and to retract said probe with respect to the stem; and
   means for inhibiting rearward movement of the wire relative to the passageway.
2. A wire-laying tool according to claim 1 in which the actuator for advancing the wire relative to the probe includes a member which is disposed to bear on wire in said passageway.
3. A wire-laying tool according to claim 2 in which the said member comprises a spring-loaded pawl.
4. A wire-laying tool according to claim 3 in which the actuator for retracting the probe is responsive to the completion of a predetermined movement of the first actuator.
5. A wire-laying tool comprising:
   an elongate body having a longitudinal passageway adapted for the passage of wire from a rear end to a front end;
   a forward extension of the passageway including a stem and a probe movably mounted with respect to the stem;
   a first resettable actuator for advancing wire relative to the passageway, said first actuator comprising a first fluid actuated piston and cylinder of which the cylinder has an inlet for the supply of fluid pressure to move the piston; and
   a second resettable actuator for retracting the probe with respect to the stem, said second actuator comprising a second fluid actuated piston and cylinder; and
   a port positioned to be in communication with said inlet when the piston executes the aforementioned predetermined movement, the port being disposed to supply the fluid pressure to said second cylinder.
6. A wire-laying tool according to claim 5 in which the cylinders are disposed parallel to each other in a direction lengthwise of the tool and have opposite actuating directions.
7. A wire-laying tool according to claim 5, further comprising means for inhibiting rearward movement of the wire in the said passageway.
8. A wire-laying tool comprising:
   an elongate body having a longitudinal passageway adapted for the passage of wire from a rear end to a front end;
   a forward extension of the passageway including a stem, said stem constituting a sleeve;
   a probe movably mounted in said sleeve;

a first resettable actuator including a pawl positioned to bear on wire in said passageway for advancing said wire;

a second resettable actuator for retracting the said probe with respect to the stem; and means for inhibiting rearward movement of the wire relative to the passageway.

9. A wire-laying tool according to claim 8 in which the means for inhibiting rearward movement of the wire in the said passageway comprises a spring-loaded dog protruding into the passageway.

10. A wire-laying tool comprising:

an elongate body having a longitudinal passageway adapted for the passage of wire from a rear end to a front end;

a forward extension of the passageway including a stem and a probe movably mounted with respect to the stem;

a member which is disposed to bear on wire in said passageway;

a first resettable actuator coupled to said member for advancing said wire relative to the passageway;

a second resettable actuator for retracting the probe with respect to the stem, the second actuator being responsive to the completion of a predetermined movement of the first actuator; and means for inhibiting rearward movement of the wire relative to the passageway.

* * * * *